US006960773B2

(12) United States Patent
Menon et al.

(10) Patent No.: US 6,960,773 B2
(45) Date of Patent: Nov. 1, 2005

(54) SYSTEM AND METHOD FOR MASKLESS LITHOGRAPHY USING AN ARRAY OF IMPROVED DIFFRACTIVE FOCUSING ELEMENTS

(75) Inventors: Rajesh Menon, Boston, MA (US); Dario Gil, Cambridge, MA (US); David Carter, Cambridge, MA (US); Henry I. Smith, Sudbury, MA (US); George Barbastathis, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/624,316

(22) Filed: Jul. 21, 2003

(65) Prior Publication Data

US 2004/0069957 A1 Apr. 15, 2004

Related U.S. Application Data

(60) Provisional application No. 60/397,705, filed on Jul. 22, 2002, and provisional application No. 60/404,514, filed on Aug. 19, 2002.

(51) Int. Cl.$^7$ .............................................. G03F 7/207
(52) U.S. Cl. ..................................... 250/492.2; 378/34
(58) Field of Search ....................... 250/492.2; 378/34; 359/571, 573, 574, 575; 355/53, 67, 77

(56) References Cited

U.S. PATENT DOCUMENTS

| 5,071,207 A | 12/1991 | Ceglio et al. |
|---|---|---|
| 5,078,513 A | 1/1992 | Spaulding et al. |
| 5,159,586 A | 10/1992 | Yamashita et al. |
| 5,245,619 A * | 9/1993 | Kronberg .................... 372/32 |
| 5,257,132 A | 10/1993 | Ceglio et al. |
| 5,262,893 A | 11/1993 | Shrauger et al. |
| 5,263,073 A | 11/1993 | Feldman |
| 5,822,119 A | 10/1998 | Rasmussen et al. |
| 5,900,637 A * | 5/1999 | Smith ..................... 250/492.22 |
| 6,046,859 A * | 4/2000 | Raj ............................. 359/649 |
| 6,133,986 A * | 10/2000 | Johnson ....................... 355/67 |
| 6,330,118 B1 | 12/2001 | Daschner et al. |
| 2003/0123040 A1 | 7/2003 | Almogy |

OTHER PUBLICATIONS

"Sharper images by focusing soft X–rays with photon sieves," Kipp et al. *Nature*. Nov. 2001. vol. 414.
"Zone plate for arbitrarily high focal depth," Ojeda–Castaneda et al. *Applied Optics*. Mar. 1990. vol. 29, No. 7.
Gil et al., "Lithographic patterning and confocal imaging with zone plates," *J. Vac. Sci. Technol. B*, vol. 8(6), (Nov./Dec. 2000): 2881–2885.
Eisner et al., "Confocal microscopy with a refractive microlens– pinhole array," *Optics Letters*, vol. 23(10), (May 15, 1998), 748–749.
Ahn, S.H. and Y.K. Kim, "Proposal of human eye's crystalline lens–like variable focusing lens," *Broadband Optical Networks and Technologies: An Emerging Reality/ Optical MEMS/ Smart Pixels/ Organic Optics and Optoelectronics. 1998 IEEE*, :II/89–II/90.
Kipp et al., "Sharper images by focusing soft X–rays with photon sieves," *Nature*, vol. 414, (Nov. 8, 2001): 184–188.
Hoshino, K. and I. Shimoyama, "An Elastic Thin–Film Microlens Array With a Pneumatic Actuator," *Micro Electro Mechanical Systems, 2001. MEMS 2*, 321–324.

* cited by examiner

*Primary Examiner*—Jack I. Berman
(74) *Attorney, Agent, or Firm*—Gauthier & Connors LLP (57) ABSTRACT

A maskless lithography system is disclosed that includes an array of blazed diffractive zone plates, each of which focuses an energy beam into an array of images in order to create a permanent pattern on an adjacent substrate in certain embodiments. In further embodiments, an array of apodized diffractive elements may also be used.

15 Claims, 10 Drawing Sheets

Gaussian apodizer

*Fig. 11*

Inverse Gaussian apodizer

SYSTEM AND METHOD FOR MASKLESS LITHOGRAPHY USING AN ARRAY OF IMPROVED DIFFRACTIVE FOCUSING ELEMENTS

PRIORITY

This application claims priority to U.S. Provisional Application Ser. No. 60/397,705 filed Jul. 22, 2002 and U.S. Provisional Application Ser. No. 60/404,514 filed Aug. 19, 2002.

This invention was made with government support under Grant No. DAAD19-01-1-0330 awarded by United States Army. The United States government has certain rights in the invention.

BACKGROUND OF THE INVENTION

The invention relates to maskless lithography, and relates in particular to maskless lithography using arrays of diffractive focusing elements.

Diffractive focusing elements differ from refractive focusing elements such as ordinary glass lenses in that the directing of incident radiation to a focus is accomplished by means of constructive interference of waves emanating from multiple regions of the element, with those regions organized in shape and location so as to accomplish said constructive interference. The simplest example of a diffractive focusing element is a pinhole, and diffractive focusing systems using pinholes may be used, for example, in pinhole cameras, in the imaging of gamma rays in medicine, or in the focusing of high energy particles.

U.S. Pat. No. 5,900,637 discloses a system for maskless lithography based on an array of diffractive focusing elements known as Fresnel zone plates. In particular, U.S. Pat. No. 5,900,637 discloses the use of various diffractive focusing elements for applications in which the source produces an electromagnetic field (e.g., x-rays) that would be absorbed by traditional refractive focusing elements. Such diffractive focusing elements disclosed in U.S. Pat. No. 5,900,637 include amplitude Frensel zone plates (which consist of alternating opaque and transparent regions), Fresnel phase plates (which consist of alternating transparent regions that provide a relative phase shift of 180 degrees), and mixed Fresnel zone plates (which consist of alternating regions that provide both alternating amplitudes and relative phase shift).

Although such diffractive focusing elements may be used in lithography systems employing radiation other than x-rays, amplitude Fresnel zone plates typically provide an efficiency of focusing incident radiation into the first-order focus of approximately 10%, while Fresnel phase plates typically provide an efficiency of focusing into the first-order focus of approximately 40%. Higher efficiencies are highly desirable for most lithographic applications. Moreover, some applications, such as the focusing of pure x-ray wavelengths, are not possible using only Fresnel phase plates, requiring the use of mixed Fresnel zone plates.

There remains a need therefore, for a diffractive focusing system that may be used more efficiently and economically in a maskless lithography system.

SUMMARY OF THE INVENTION

The invention provides in an embodiment, a maskless lithography system that includes an array of blazed diffractive zone plates, each of which focuses an energy beam into an array of images in order to create a permanent pattern on an adjacent substrate. In further embodiments, the blazed diffractive zone plates are apodized Fresnel zone plates. In still further embodiments, the invention provides a maskless lithography system that includes an array of photon sieves, and in further embodiments, the photon sieves may be amplitiude photon sieves, phase-photon sieves, and alternating-phase photon sieves. In still further embodiments, these photon sieves may be apodized.

BRIEF DESCRIPTION OF THE DRAWING

The following description may be further understood with reference to the accompanying drawings in which.

The drawings are shown for illustrative purposes and are not to scale.

DETAILED DESCRIPTION OF THE INVENTION

The invention provides improvements for the technique of zone-plate-array lithography by the use of a variety of improved diffractive focusing elements, including: blazed Fresnel phase plates, apodized Fresnel zone plates, apodized Fresnel phase plates, apodized blazed Fresnel phase plates, amplitude photon sieves, phase-shifting photon sieves, apodized photon sieves, diffractive focusing elements for improved depth-of-field (such as Bessel zone plates) and reflective Fresnel zone plates.

Figure 1A:
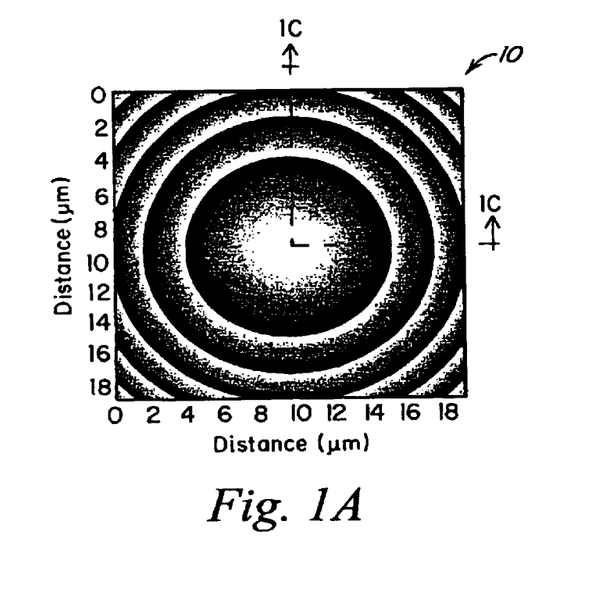
FIG. 1A shows an illustrative diagrammatic plan view of a blazed Fresnel zone plate for use in a maskless lithography system in accordance with an embodiment of the invention.
Figure 1B:
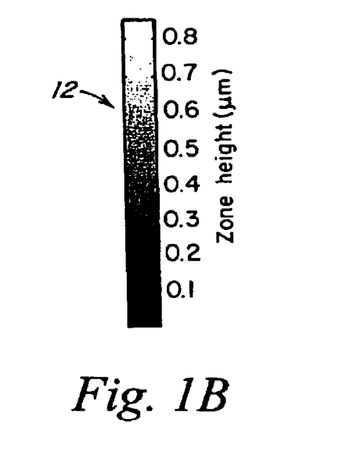
FIG. 1B shows an illustrative diagrammatic view of the shading scheme of the blazed Fresnel zone plate of FIG. 1A.
Figure 1C:
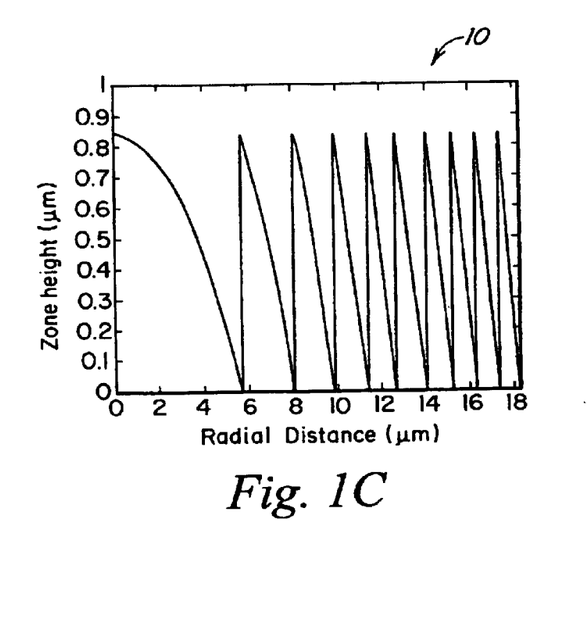
FIG. 1C shows an illustrative diagrammatic sectional view of the blazed Fresnel zone plate of FIG. 1A taken along line 1C—1C thereof.

FIGS. 1A–1C show a blazed Fresnel phase plate 10 for use in a lithography system in accordance with an embodiment of the invention. The blazed Fresnel zone plate 10 is designed for operation at a wavelength of 400 nm, a focal length of 40 micrometers, and includes 10 zones. FIG. 1A shows a plan view of the zone plate 10, FIG. 1B shows the shading scheme 12 for the various thicknesses of the zone plate 10 in FIG. 1A, and FIG. 1C shows a cross-sectional view of the zone plate 10 taken along line 1C—1C of FIG. 1A, showing the thickness as a function of distance from the center of the zone plate 10. The zone plate 10 is a form of a Fresnel zone plate in which the phase shift introduced by any given zone varies from zero to 360 degrees across the zone. The blazed Fresnel zone plate 10 is a combined diffractive-refractive element that may focus 100% of the incident radiation into the first-order focus, assuming there to be negligible attenuation through the material, which is the case for UV and deep UV radiation in glasses such as pure silica, and single crystals such as calcium fluoride.

Figure 2:
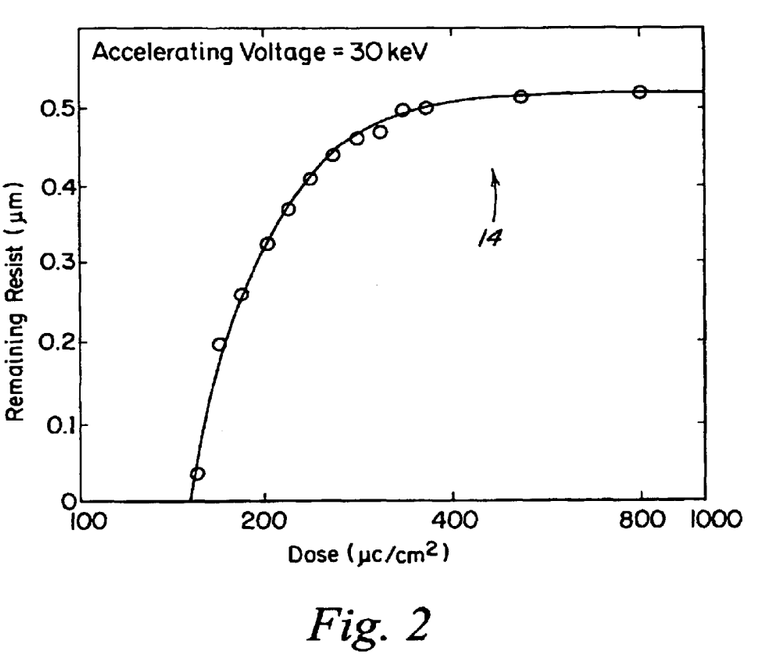
FIG. 2 shows an illustrative diagrammatic graphical representation of the changes in the thickness of a resist as a result of changes in a dose delivered by an electron beam.

The method of fabricating blazed Fresnel phase plates makes use of a class of electron-beam resists known as hydrogen silsesquioxane (HSQ). The resists themselves are glass like, and for very thin layers will introduce negligible attenuation at UV and deep UV wavelengths. For a given initial thickness of HSQ, the thickness remaining depends on the electron beam dose, as shown at 14 in FIG. 2, which shows that the thickness of HSQ may be controlled by controlling the dose delivered by an electron beam.

Figure 3A:
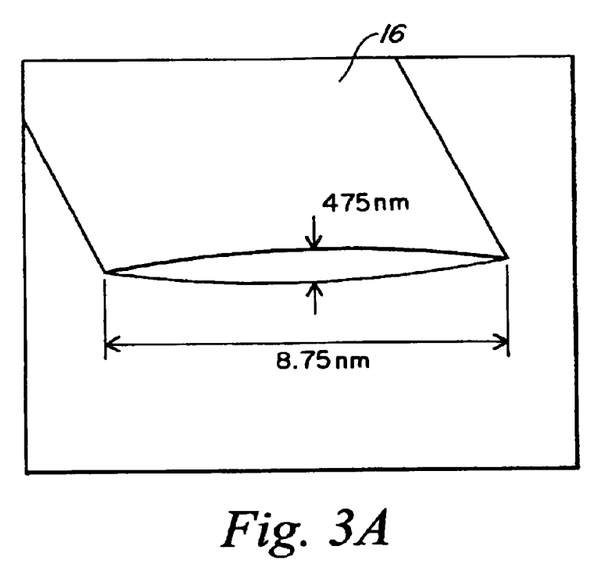
FIGS. 3A and 3B show an illustrative diagrammatic views of portions of a substrate that demonstrate a process for forming a blazed Fresnel zone plate for use in a maskless lithography system in accordance with a further embodiment of the invention.
Figure 3B:
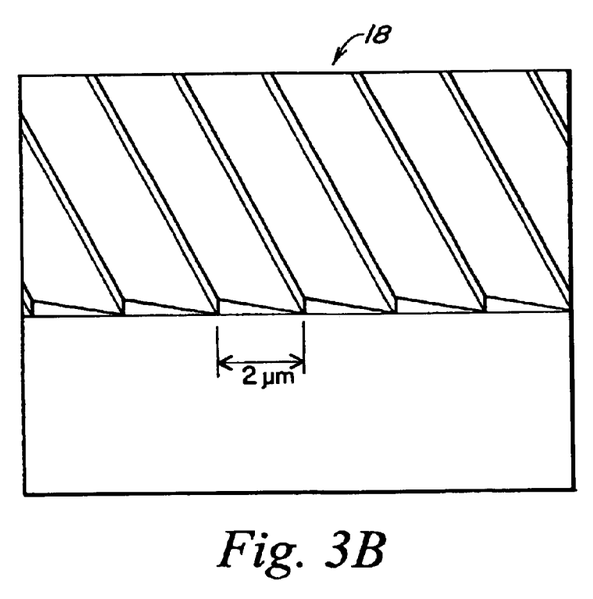

By varying the dose in scanning-electron-beam lithography therefore, one may vary the thickness of zones, as indicated in the illustrative depictions of electron micrographs in FIGS. 3A and 3B. FIG. 3A shows a representation of a scanning electron micrograph of experimental results with HSQ demonstrating that a blazed structure 16 (i.e., structures in which the thickness if varied in a programmed way) may be achieved with this material using electron-beam lithography and a suitably varied dose. FIG. 3B shows that a repetitious blazed structure 18 may also be achieved with this material using electron-beam lithography and a suitably varied dose. Blazed diffractive focusing elements may also be designed using subwavelength structures as described by J. N. Mait, D. W. Prather, and M. S. Mirotznik in *Design of binary subwavelength diffractive lenses by use of zero$^{th}$-order effective medium theory*, J. Optical Society, Am., Vol. 16. No. 5, 1999.

The use of such blazed Fresnel zone plates permits very high efficiency for lithographic applications in which the energy beam is not absorbed by the zone plates themselves. The result is a very high efficiency of focusing into the first order. The use of an array of such blazed Fresnel zone plates provides an improved lithographic system that may achieve very high first-order focusing efficiencies (e.g., at least 50%) for energies that are not strongly absorbed by the zone plates themselves.

The lithography systems in which such improved diffractive focusing elements may be used in accordance with certain embodiments include those disclosed in U.S. Pat. No. 5,900,637, the disclosure of which is hereby incorporated by reference. In particular, an array of blazed Fresnel zone plates may be arranged on a silicon substrate, wherein each zone plate defines a unit cell. The array is supported on a thin membrane with vertical, anisotropically-etched silicon (Si) joists for rigid mechanical support that divide rows of unit cells. Each zone plate is responsible for exposure only within its unit cell. The silicon joists are intended to provide additional rigidity to the array while minimizing obstruction. Methods of anisotropic etching of silicon are well known, and are capable of producing in silicon joists of about one or a few micrometers in thickness. In alternative embodiments of this invention, the joists are not necessary, and the substrate need not be formed of silicon.

The membrane is formed of a material that is transparent to the source wavelength. If the source is 4.5 nm x-ray, then the membrane may be formed of a thin carbonaceous material. If deep UV radiation is used, the membrane may be made of glass, and the zone plates could be made from phase zone plates, e.g., grooves cut into the glass membrane.

Figure 4:
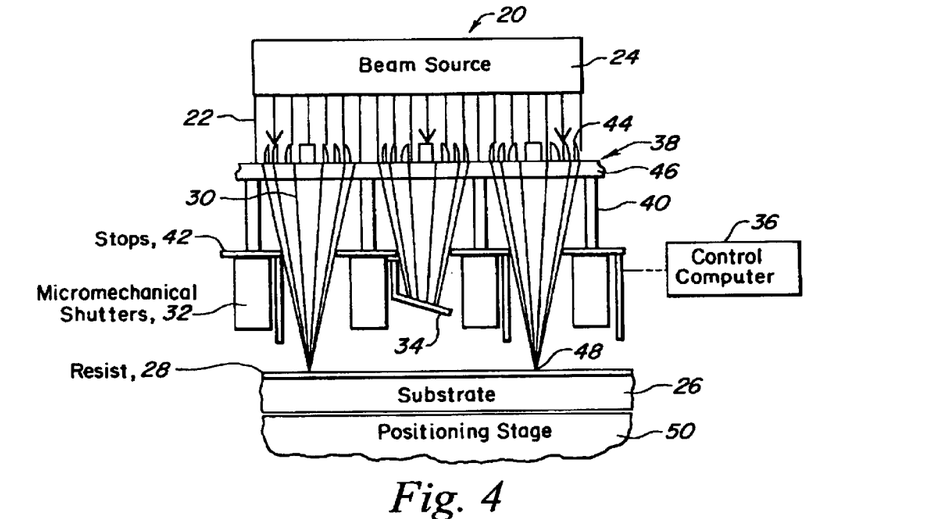
FIG. 4 shows an illustrative diagrammatic schematic view of an embodiment of a maskless lithography system including blazed Fresnel zone plates in accordance with an embodiment of the invention.

FIG. 4 shows a cross-sectional schematic view of an embodiment of a maskless lithography arrangement 20 in accordance with the invention illustrating the focusing of incident beam 22 from a beam source 24 onto a substrate 26 coated with a resist 28 as focused beamlets 30. The arrangement includes micro-mechanical shutter devices 32 with actuated shutters 34 that turn the focused beams on and off in response to commands from a control computer 36. The shutter devices 32 may be interposed between the zone-plate array 38, joists 40, stops 42, and the substrate 26. The second beam from the left is indicated as being in the off state.

As shown, each of the zone plates 44 on the membrane 46 of the array 38 is able to focus a collimated beam 22 to a fine focal spot 48 on the resist-coated substrate 26, which is supported on a positioning stage 50. To write a pattern, the substrate is scanned under the array, while the individual beamlets 30 are turned on and off as needed by means of the micromechanical shutters 32, one associated with each zone plate. These shutters may be located either between the zone plate array and the substrate, i.e., down-stream, as illustrated in FIG. 4, or between the zone plate array and the source of radiation, i.e., up-stream, as shown in FIG. 5.

Figure 5:
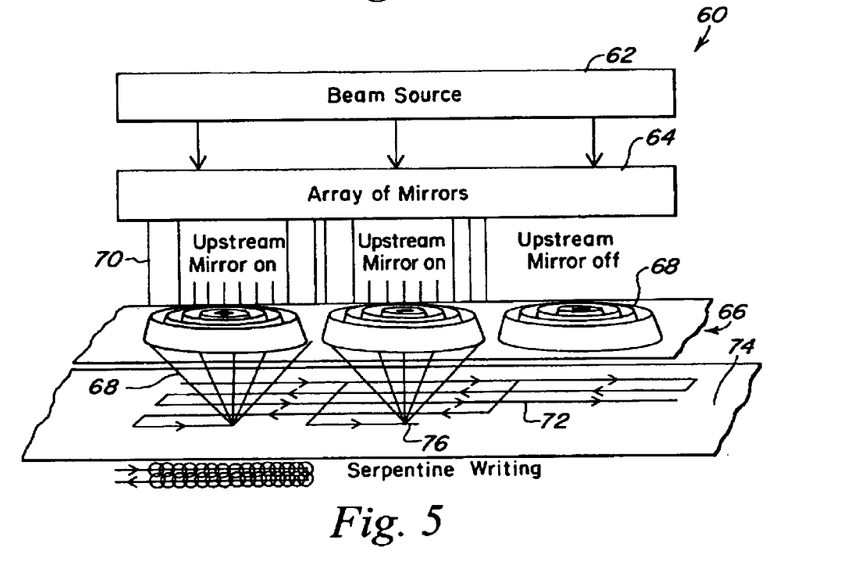
FIG. 5 shows an illustrative diagrammatic schematic view of another embodiment of a maskless lithography system including blazed Fresnel zone plates in accordance with an embodiment of the invention.

FIG. 5 shows is an illustration of a possible writing scheme used in connection with an embodiment of a maskless lithography system 60. The arrangement includes a radiation source 62 and an array of upstream mirrors 64 that are positioned between an array 66 of blazed Fresnel zone plates 68. A serpentine writing scheme 70 is depicted, with the substrate scanned in X and Y by a fast piezoelectric system (not shown), thereby filling in the full pattern. Radiation is readily reflected at glancing angles from a polished surface. Accordingly, an array of micromechanical, deflectable glancing-angle mirrors 64, located upstream, may be used to turn individual focused beams 70 on and off.

Texas Instruments, Inc. of Dallas, Tex. has developed a visible-light projection display system that employs an array of deflectable micromechanical mirrors. The technology for fabricating and deflecting such micromechanical mirrors, therefore, is known in the art.

There are various strategies through which the scanning and writing may be achieved. One is to employ a square array of zone plates, with each zone plate writing only within its unit cell as discussed above. The scanning in this case would be serpentine, as depicted at 72 in FIG. 5, with the positioning stage and hence the substrate 74 moving only a distance equal to the unit cell edge dimension in X and Y until all pixels within the unit cell are addressed, and either written (i.e., shutter open) at a focal spot 76 or not (i.e., shutter closed). An alternative to a this step-and-scan strategy, is a linear-scan strategy similar to that described by M. Feldman, OSA Proceedings on Soft-X-ray Projection Lithography, Eds. A. M. Hawryluk and R. H. Stulen (Opt. Soc. Amer., Washington, D.C.) 18, 207 (1993), incorporated herein by reference. In Feldman's scheme, a close-packed array of zone plates would be azimuthally rotated relative to the scanning direction in such a way that all pixels can be addressed when the substrate is scanned along one direction only.

Apodization may also be applied to diffractive elements in lithographic systems of the invention. The utilization of the incident radiation across the diameter of the diffractive focusing element may be varied gradually as a function of radial distance so as to suppress the sidelobes or secondary maxima. The effect of apodization is to suppress the sidelobes or secondary maxima of the focus, as is known in the art. Apodization of a Fresnel zone plate causes a suppression of the sidelobes at the expense of a somewhat wider focal spot.

Figure 6A:
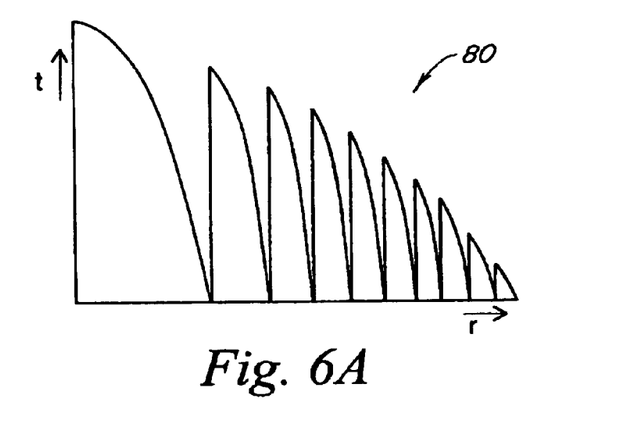
FIGS. 6A–6C show illustrative diagrammatic views of apodized Fresnel zone plates in accordance with further embodiments of the invention.
Figure 6B:
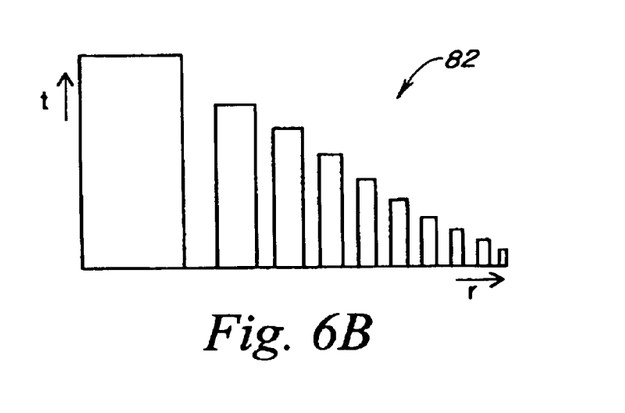
Figure 6C:
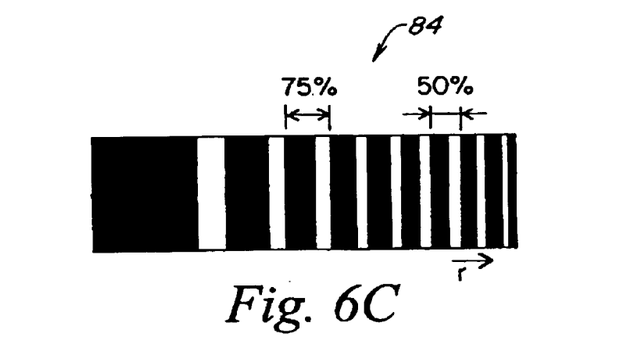

As generally shown in FIG. 6A, apodization of a blazed Fresnel zone plate 80 may be achieved by reducing the relative thicknesses of the blazed Fresnel zones in the radially outward direction. Apodization of a phase Fresnel zone plate 82 may also be achieved by reducing the relative zone thicknesses as generally shown at 82 in FIG. 6B. Apodization of an amplitude Fresnel zone plate 84 may be achieved by reducing the duty cycle within each zone as shown at 84 in FIG. 6C. Apodization of mixed Fresnel zone plates may also be employed in accordance with further embodiments of the invention.

A virtue of diffractive focusing elements is that their form may be written by scanning-electron-beam lithography. Zones or other diffracting features may be positioned as desired and their sizes may be controlled with precision. Accordingly, one may deviate from the traditional format of a Fresnel zone plate to achieve a particular characteristic in the focused field. There is a wide variety of diffractive focusing elements beyond those discussed above that may be conceived and created by electron beam lithography. Further diffractive focusing elements may differ in focusing efficiency, in the magnitude of the higher orders, in the magnitude of the zero-order radiation, and in the magnitude of the sidelobes. Accordingly, depending on the pattern one wishes to create with the maskless lithography system, one could choose to deviate from the traditional format of Fresnel zone plates while retaining the virtues of diffractive focusing and multiplexed writing. Maskless lithography systems, therefore, may be created in which the focusing elements are based on diffraction, and the radiation is multiplexed to the elements. Reflective Fresnel zone plates may also be implemented at normal incidence or at an oblique angle. In further embodiments, an array of mirrors may act as both the multiplexing system and the array of focusing elements.

One application of the HSQ-based fabrication technique is the apodization of zone plates. Because it is possible to control the thickness of each of the zones by controlling the amount of e-beam dose delivered into the HSQ, the amount of phase delay of certain zones may be effectively controlled. This phase modulation, if properly designed, may be used to shape the point-spread function (PSF) of the zone plate for ultra-fine resolution, extended or reduced depth-of-field, reduced side lobes, etc.

Conventionally, apodization is implemented by reducing the transmissivity of the pupil near the edges or near the center. See, for example, J. W. Goodman, "Introduction to Fourier Optics", $2^{nd}$ ed. Pp. 151–154, McGraw-Hill 1996. Apodizing near the edges attenuates the high spatial frequencies and results in a PSF that has a broader main lobe albeit lower side-lobes. Conversely, apodizing near the center attenuates the low spatial frequencies and has the opposite effect (narrower main lobe at the expense of higher side lobes). Unlike such conventional apodization, it has been discovered that one may apodize the phase of the binary element instead of the transmissivity. For example, one possibility is to create a phase zone plate such that the central zones introduce a 180 degree phase delay, as is customary, but the exterior zones introduce phase delay that progressively decreases from the nominal 180 degree value as we move towards the edge of the zone plate.

Figure 7A:
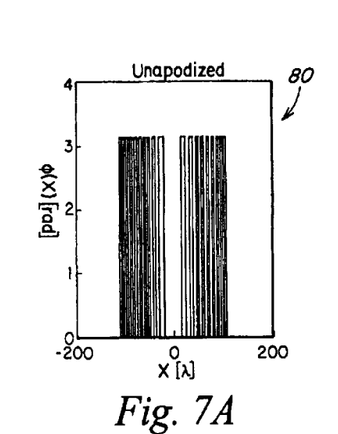
FIGS. 7A and 7B show illustrative diagrammatic views of an unapodized Fresnel phase plate; and an intensity distribution of the resulting point spread function respectively.
Figure 8A:
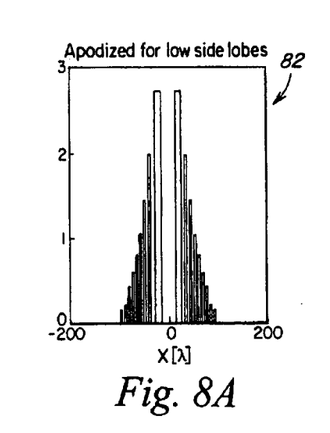
FIGS. 8A and 8B show illustrative diagrammatic views of a Fresnel phase plate apodized for low side lobes in accordance with another embodiment of the invention; and an intensity distribution of the resulting point spread function, respectively.
Figure 9A:
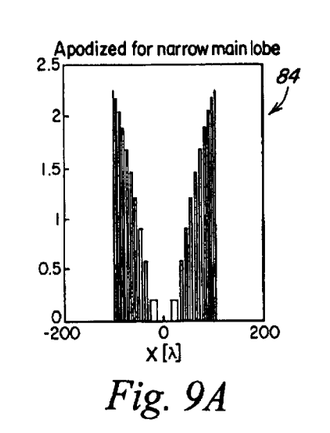
FIGS. 9A and 9B show illustrative diagrammatic views of a Fresnel phase plate apodized to achieve a narrow main lobe in accordance with another embodiment of the invention; and an intensity distribution of the resulting point spread function, respectively.

FIG. 7A shows a cross-sectional view of the phase delay in radians of an unapodized zone plate 80, i.e., with a phase shift for each zone constant and equal to 180 degrees. FIG. 8A shows a cross-sectional view of the phase delay in radians of a zone plate 82 that is provided with phase apodization in such as way as to reduce the height of the side lobes. FIG. 9A shows a cross-sectional view of the phase delay in radians of a zone plate 84 that is provided with phase apodization so as to reduce the width of the first-order lobe. In particular, for the zone plate 82, the phase shift decreases away from the center according to the relationship:

$$\phi(r) = \pi \times \exp\left(-\frac{r^2}{2\sigma^2}\right), \qquad 1$$

where r is the radius at the center of the zone and σ is a parameter that controls the apodizer strength, i.e., the degree of apodization. This zone plate may be referred to as the Gaussian apodizer. The third zone plate 84 is apodized according to the relationship:

$$\phi(r) = \pi \times \left[1 - \exp\left(-\frac{r^2}{2\sigma^2}\right)\right], \qquad 2$$

and may be referred to as the inverse Gaussian apodizer.

Apodizing zone plates may create a PSF that has either a sharper spot, or lower side lobes, depending on the design. The intensity distributions of the resulting point spread functions are respectively shown in at 90, 92 and 94 in FIGS. 7B, 8B and 9B. In particular, as shown at 90 an unapodized zone plate may provide a PFS that includes an identifiable main lobe as well as identifiable side lobes. By apodizing for low side lobes (FIG. 8A), a PFS may be provided that significantly reduces the side lobes (FIG. 8B), although the focal area of the main lobe may increase slightly. By apodizing for a narrow main lobe (FIG. 9A), a PFS may be provided that significantly reduces the width of the main lobe (FIG. 9B) with an attendant increase in the side lobes.

These three zone plates were simulated using scalar diffraction theory. The distances were normalized with respect to the wavelength, and therefore the unit of distance is given as λ. The zone plate design was for focal length $f=500\lambda$, the zone plates had N=10 zones, and the apodizer widths were σ=40λ and 60λ for the Gaussian and inverse Gaussian case, respectively.

Figure 7B:
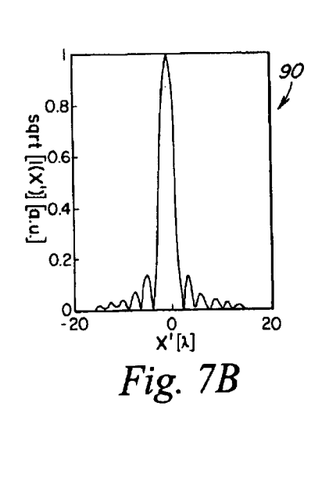
Figure 8B:
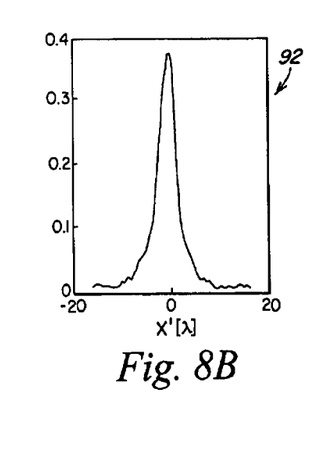
Figure 9B:
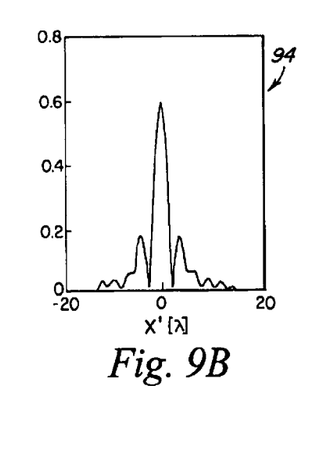

FIGS. 7B, 8B and 9B are calculated as the intensity distribution exactly at the focal plane (i.e., distance $f$ away from the zone plate.) The square-root of the intensity distribution, i.e., the magnitude of the optical field is plotted to enhance the visibility of the side lobes. It may be seen that the Gaussian apodizer broadens the main lobe of the PSF but completely eliminates the side lobes, whereas the inverse Gaussian apodizer narrows the main lobe at the expense of higher side lobes. Note that an additional benefit of apodization is that it breaks the periodicity that is inherent in the standard zone plate, thus strongly attenuating the higher diffracted orders. Unfortunately, the +1 diffracted order (the desired focus) is attenuated as well, as may be seen in FIG. 8B.

Figure 10:
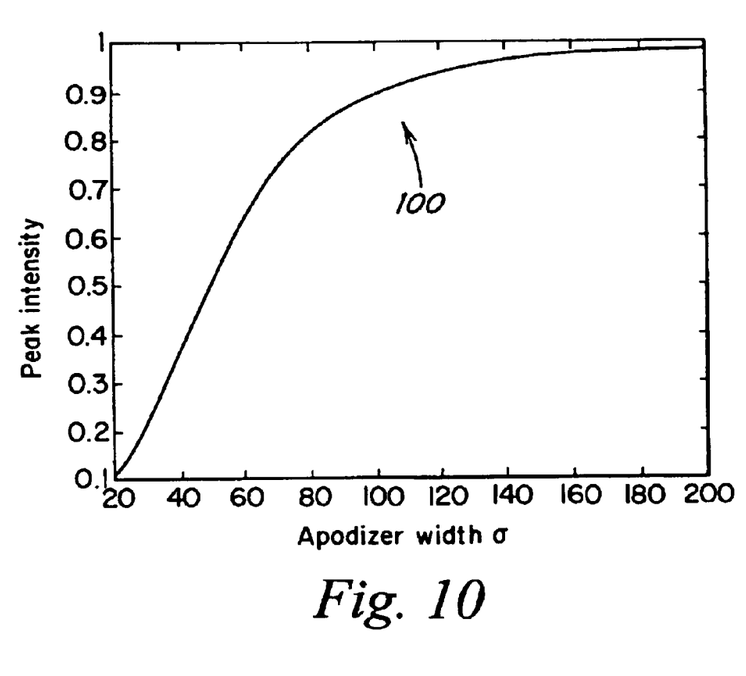
FIG. 10 shows an illustrative graphical view of the diffraction efficiency as a function of the degree of apodization.
Figure 11:
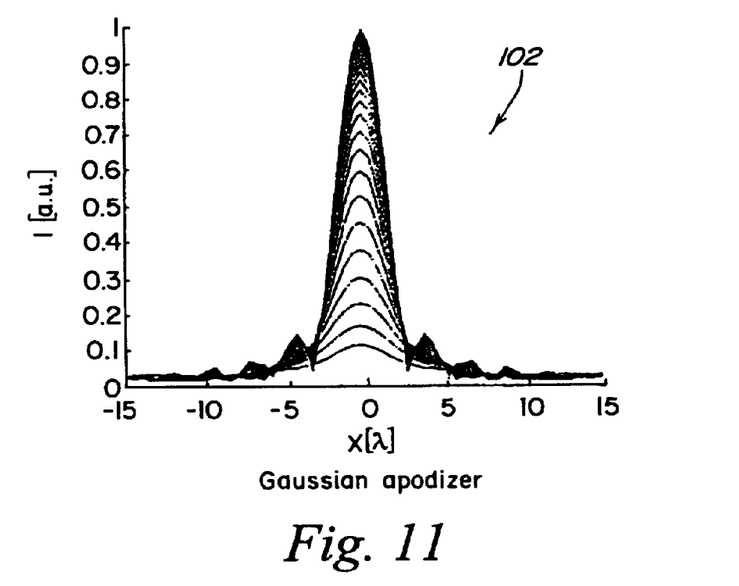
FIG. 11 shows an illustrative graphical view of the point spread function for a Gaussian apodized zone plate.
Figure 12:
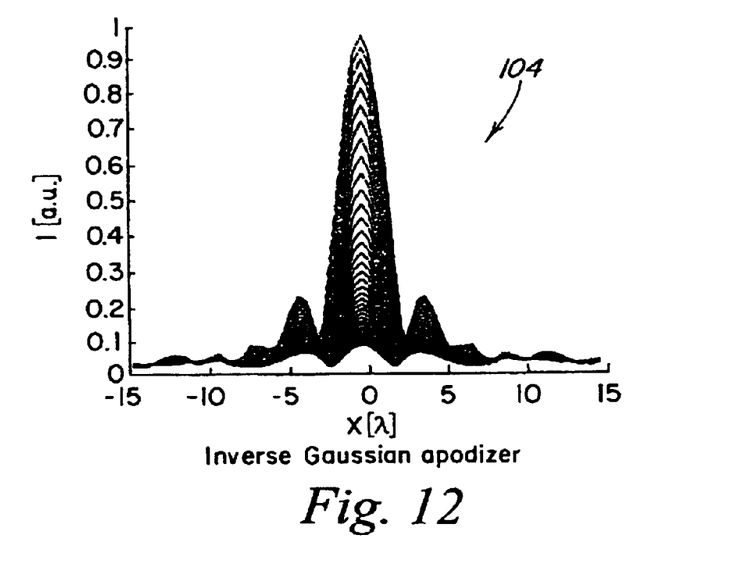
FIG. 12 shows an illustrative graphical view of the point spread function for an inverse Gaussian-apodized zone plate.

The diffraction efficiency of the Gaussian apodizer as function of the width σ is shown at 100 in FIG. 10 relative to the diffraction efficiency of the unapodized zone plate. The efficiency of the unapodized zone plate (σ=∞) was taken to be equal to one in this plot. The parameter σ may be thought of as a design knob that may be adjusted to achieve the optimum desired intensity distribution at the focal plane. The effect of σ on diffraction efficiency and side lobe distribution is shown at 102 in FIG. 1 for the Gaussian apodizer. For example, if a high-contrast resist is intended to be used, then the side-lobe shape may be accounted for (with some form of proximity-effect correction) in order to achieve patterns of high resolution. Therefore, it makes sense in this case to use an inverse Gaussian type of apodizer, which results in narrower side-lobes for a given numerical aperture (NA) as shown at 104 in FIG. 12. Note that extreme apodization (σ≦40 wavelengths in this example) may result in the sidelobes becoming larger than the main lobe. The diffraction pattern then looks like a ring, which is undesirable for many applications.

The effect of apodization on the depth of focus of the zone plates has also been examined. The Gaussian apodizer results in decreased depth-of-focus whereas the inverse Gaussian apodizer improves the depth-of-focus. The progressive defocus was determined as a fraction of the focal length (e.g., defocus=0.01 means that the observation plane is 0.01×$f$ away from the focal plane). This is a direct consequence of apodizer behavior with respect to the high spatial frequencies, which control the focal tightness. The PSF and diffraction efficiency may be controlled, therefore by controlling the degree of apodization σ. The PSF progression may be developed as σ varies from 20 microns to 200 microns in steps of 5 microns. The diffraction efficiency of the unapodized zone plate (σ=∞) may be taken to be equal to 1.

It should be noted that all the above results and the selection of Gaussian and inverse Gaussian apodizers are indicative of the capabilities afforded to a lithography system designer by the apodization method for zone plates. Optimization methods may be utilized to meet more specific functional requirements in terms of main lobe width, side lobe strength, depth of focus, etc. The HSQ-based fabrication method enables the implementation of any phase profile that might result from the optimization.

Photon sieves as described in *Sharper Images by Focusing Soft X-rays with Soft Photon Sieves*, by L. Kipp, M. Skibowski, R. L. Johnson, R. Berndt, R. Adelung and R. Seeman, Nature 414, (184), 2001, the disclosure of which is hereby incorporated by reference, may also be used as diffractive elements in lithography systems of the invention in accordance with certain embodiments. The amplitude photon sieve consists of a large number of pinholes distributed appropriately over the zones of a Fresnel zone pattern. For a given minimum resolution in the fabrication, it achieves a sharper focus than the corresponding amplitude Fresnel zone plate, and, in addition, higher orders of diffraction and secondary maxima are suppressed by several orders of magnitude (i.e., they are substantially eliminated). It is known in the art that properly fabricated conventional amplitude Fresnel zone plates absorb or reflect about 50% of the incident radiation. Of the remaining 50%, about 25% goes into the undesirable zero-order radiation, about 10% into the desirable first-order focus, about 10% into an undesirable negative (i.e., virtual) first-order focus, and about 5% into the positive and negative third-order foci. It is also well known that the focal spot of an amplitude Fresnel zone plate has side lobes or secondary maxima. This is characteristic of the focal spot of lenses as well, and stems from the fact that the utilization by the focusing element of the incident radiation is uniform across the diameter of the lens or diffractive focusing element. In the photon sieve, the distribution of pinholes (and hence the utilization of the incident radiation) may be adjusted to achieve apodization as discussed above. For amplitude photon sieves, apodization also consists of varying the strength of the utilization as a function of radial distance so as to follow approximately the functional form of a Gaussian distribution. Again, the secondary maxima or side lobes of the focal spot are reduced or substantially eliminated. The diameters of the pinholes in a photon sieve are related to the corresponding zone widths in a conventional Fresnel zone plate, i.e., they vary as a function of radial distance. The ratio of pinhole diameter to the corresponding zone width is denoted by K The amplitude photon sieve is typically less efficient in focusing incident radiation into a first-order focus than an amplitude Fresnel zone plate. Because of its ability to suppress third-and higher-order foci, as well as side lobes, however, it is an attractive alternative to conventional Fresnel zone plates for the diffractive focusing elements in the array of elements in situations where efficiency of focusing is not as important a consideration but side lobe suppression relatively important.

Figure 13:
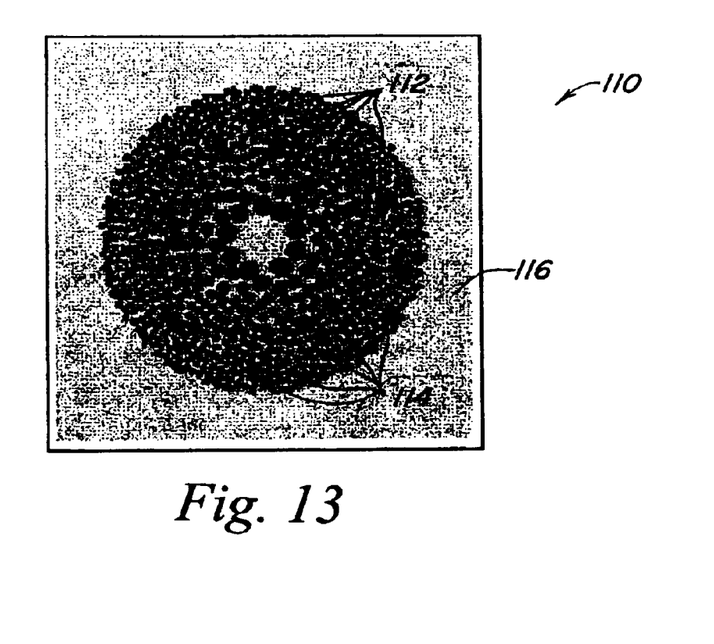
FIG. 13 shows an illustrative diagrammatic view of an alternating-phase photon sieve for use in a lithography system in accordance with an embodiment of the invention.

We have discovered that one may design a photon sieve based on the principle of phase shifting rather than amplitude modulation. In this case, pinholes in alternate zones would have a phase shift of 180 degrees (pi radians). This ensures that the zero-order radiation is suppressed. The phase-shifted pinholes must then have the same K as the pinholes of an amplitude photon sieve. Such a diffractive element is shown at 110 in FIG. 13 and is referred to herein as an alternating-phase pinhole sieve. Pinholes shown at 114 having K equal to either (3.5, 7.5 . . . ) should be phase shifted by 180 degrees relative to pinholes shown at 112 having K values equal to (1.5, 5.5, . . . ). The background area 116 (surrounding the holes) is opaque. A significant advantage of this phase-shifting photon sieve is the suppression of the zero order. Since the design procedure ensures that the area of the pinholes in any one zone is the same as in any other zone, the total area that is phase-shifted is equal to the total area that is not phase-shifted. This ensures that the zero-order diffraction is suppressed just as in a phase zone plate. The transmission function of a phase photon sieve of NA=0.75 operating at a wavelength of 400 nm, K=1.5, and containing 889 pinholes may be determined, and a simulated PSF for this photon sieve demonstrates that it focuses the light to a spot of FWHM diameter of about 300 nm.

Figure 14:
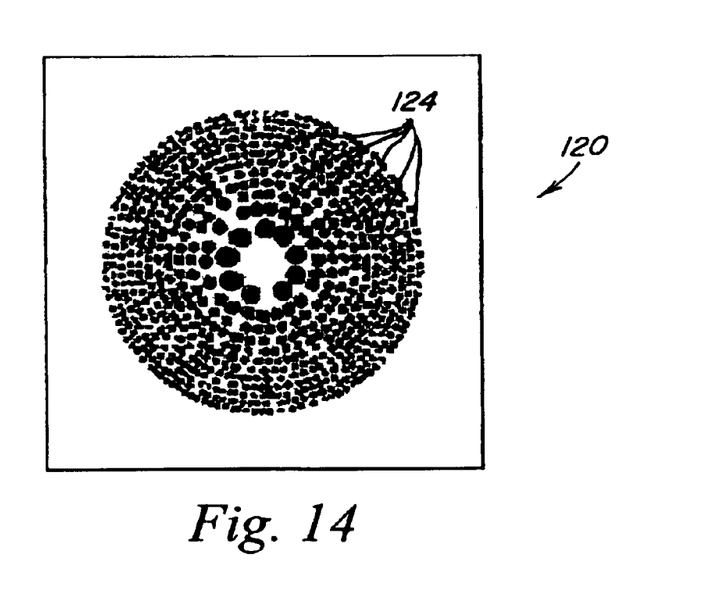
FIG. 14 shows an illustrative diagrammatic view of a phase-photon sieve for use in a lithography system in accordance with an embodiment of the invention.

Another form of a photon sieve for use in an embodiment of the invention is one where the entire area within the outermost ring of pixels of the photon sieve is transparent. Pinholes 124 of a phase shift of 180 degrees are etched into the substrate to define the sieve. Similar to a phase zone plate, 100% of the light is passes through this transparent phase-photon sieve. If the areas of the phase-shifted pinholes are matched to the rest of the area, then the zero order is suppressed. The random distribution of the pinholes will suppress unwanted diffraction orders as well. Therefore, a high percentage of the incident light may be focused into the spot. The radii of the pinholes are chosen in the same manner as for the amplitude photon sieve. The transmission function and corresponding PSF of a phase-photon sieve designed to operate at a wavelength of 400 nm, K=1.5 in the even zones, K=3.5 in the odd zones, and containing a total of 739 pinholes may be determined, and the FWHM of the focused spot may be about 239 nm.

Focusing by a photon sieve is based on the same principles as focusing by the underlying zone plate. Hence, the size of the focused spot is approximately equal to the width of the smallest zone in the underlying zone plate. The size of the pinhole is a factor of K times larger than the width of the underlying zone. The focused spot, therefore, is smaller than the smallest feature on the photon sieve. This reduction factor, K, may provide a significant advantage in certain applications. For example, this relaxes the fabrication requirements for the photon sieve considerably as compared to a zone plate of the same NA. This is especially important when the zones of the zone plate become close to the limit of the electron-beam lithography system (about 20 nm).

Figure 15:
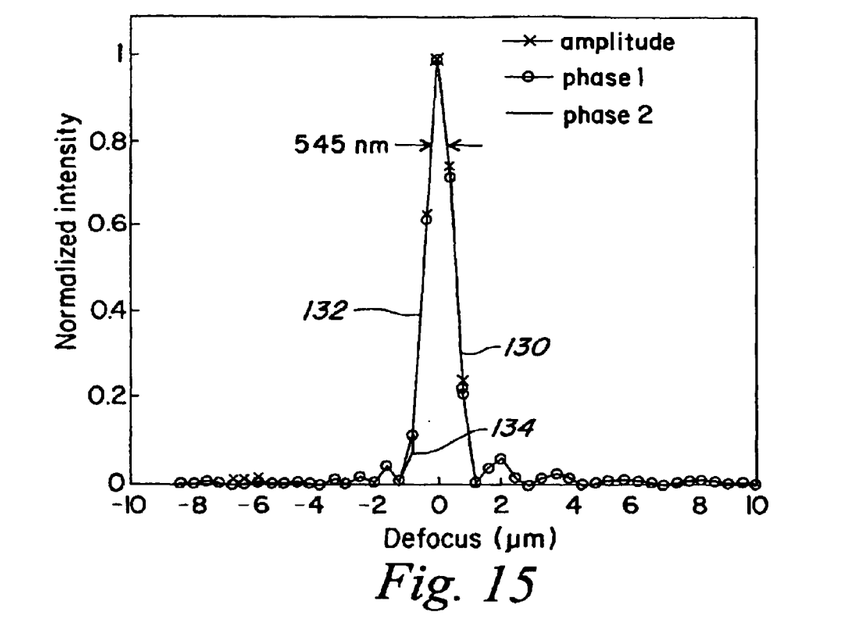
FIG. 15 shows an illustrative graphical view of the intensity distribution for each of an amplitude and two phase photon sieves for use in various embodiments of the invention.

Further, the depth-of-focus (DOF) depends on the angle subtended by the diffracted rays, which in turn depends on the numerical aperture. The DOF of the photon sieve is similar to that of the zone plate as shown in FIG. 15. As shown in FIG. 15, the normalized intensity along the axial direction is plotted for the 3 different kinds of photon sieves namely amplitude 130, alternating-phase pinhole sieve (phase 1) 132, and phase-photon sieve (phase 2) 134, which are each very similar to one another. The DOF of the simulated data is about 545 nm, which is close to the value for a zone plate.

In particular, the intensity at the center of the spot at different defocus positions from the focal plane is plotted in FIG. 15. The depth-of-focus is usually calculated as the defocus where the peak value falls about 20%. The above data gives a DOF of about 545 nm. The parameters of the sieve were a wavelength of 400 nm, and NA=0.75. For the amplitude sieve, K=1.5 for even zones and K=3.5 for the odd zones. For the phase sieves, K=1.5 for all zones for type 1, and K=1.5 (for even zones), and K=3.5 (for odd zones) for type 2.

Figure 16:
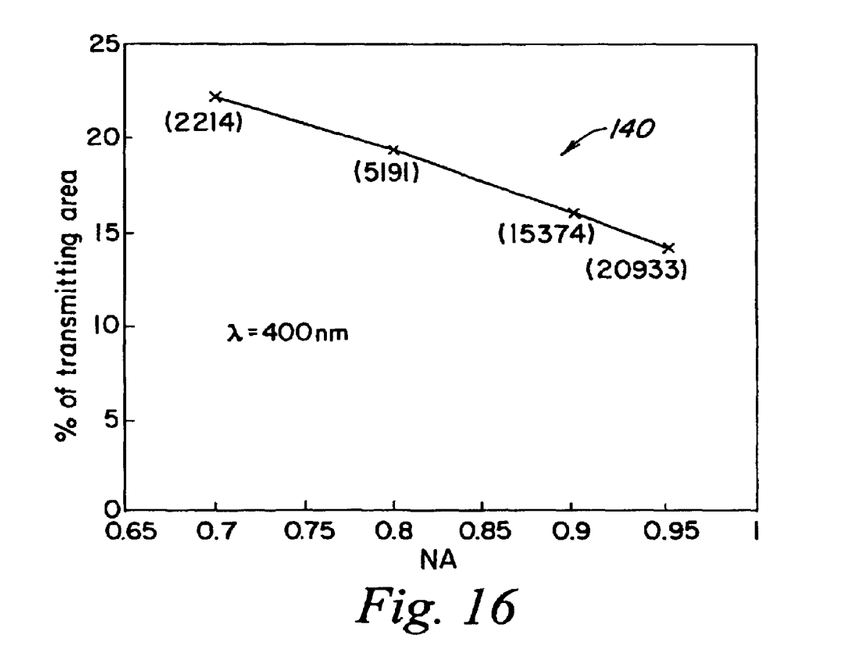
FIG. 16 shows an illustrative graphical view of the efficiency in transmission of an amplitude photon sieve for use in an embodiment of the invention.

FIG. 16 shows at 140 the percentage of transmissive area in amplitude photon sieves having different NAs. Specifically, the ratio of the area occupied by the pinholes to the total area of the underlying zone plate is plotted as a percentage for photon sieves of different NAs. The designs were performed assuming a wavelength of 400 nm and focal length of 40 microns (for NA=0.7, 0.8, and 0.9). For NA=0.95, the focal length was 30 microns. The K was chosen to be equal to 2 for odd zones and 4 for even zones. The total number of pinholes in each design is indicated beside each data point in parenthesis. Note that percentage of transmissive area is between 14% and 22%. This suggests that the focussing efficiency of the photon sieve is smaller than that of the underlying zone plate by at least a factor of 2. Also, the percentage of the transmissive area decreases as the NA of the photon sieve increases. This is due to the fact that as the NA increases, the number of zones and hence the area covered by the entire zone plate increases faster than the area covered by the pinholes.

A variety of techniques may be employed to fabricate the above discussed photon sieves. The amplitude photon sieve consists of open pinholes in an opaque substrate. This element may be fabricated by means of the same technique used to fabricate phase zone plates. HSQ, a negative electron-beam resist is spun on top of a fused silica substrate. The pattern of the open pinholes is written using scanning electron-beam lithography. After development, cylinders of HSQ are left standing on the substrate. A layer of chromium is then evaporated on top of the substrate. The chromium covering the raised cylinders is electrically insulated from the chromium covering the rest of the substrate. Using a selective electrochemical wet-etching process (Fulton-Dolan Process), the chromium can be selectively removed from the top of the cylinders. This leaves the final ampitude sieve on the substrate. An amplitude photon sieve may be created, for example, in which the wavelength is 400 nm, NA=0.7, $f$=40 microns, and the sieve contains 2214 pinholes.

An alternating-phase pinhole sieve consists of open pinholes with different phase shifts within alternate zones. The different phase shifts are obtained by a difference in the height of the cylinders used to create the photon sieve. The different heights of the cylinders are obtained by exposing HSQ at two different doses using scanning-electron-beam lithography. This may be the same technique used to fabricate blazed (or analog) diffractive elements as discussed above. After development, cylinders of two different heights in HSQ are obtained. The rest of the area (not occupied) by the cylinders may be blocked by evaporating a layer of chromium, and using the Fulton-Dolan process to remove the chromium from the top of the cylinders.

A phase-photon sieve consists of pinholes that are phase-shifted with respect to the rest of the aperture of the sieve. The entire aperture of this element is transmissive. Again, the pattern of the sieve may be written on a layer of HSQ using scanning-electron beam lithography. In addition to the pinhole pattern however, a thin ring marking the aperture of the pinhole is also written. The width of this ring is much smaller than the wavelength, so that it has very little effect on the optical performance of the element. Chromium is then evaporated over the entire substrate. Chromium inside the ring (within the sieve aperture) is electrically isolated from the rest of the chromium. The Fulton-Dolan process may then be used to remove the chromium from only inside the ring. This leaves behind the phase-shifted photon sieve.

Apodization may also be employed with the above photon sieves to suppress undesired side lobes in the PSF. In a binary diffractive element such as a zone plate, this may be achieved by modulating the duty cycle of the zones. For example, making the open zones larger than the opaque zones with increasing zone radius in an amplitude zone plate will suppress the side lobes. In an amplitude photon sieve, this apodization may be achieved by modulating the total area of the pinholes associated with a zone. Both types of phase photon sieves may be apodized by controlling the number of pin holes in each zone.

The apodization method for zone plates and photon sieves may be simpler and less expensive to realize than for refractive lens designs. The latter requires the addition of a refractive surface for every desired degree of freedom in shaping the PSF. Accurate shaping, therefore, increases the difficulties associated with weight, placement accuracy, reflection and absorption losses, etc. By contrast, in the combination of ZPAL and the HSQ-based fabrication method one may control the PSF by simply adjusting the phase delays introduced by each zone.

It is also known that a Bessel beam may propagate with minimal spreading. By combining the Bessel beam with a focusing element, such as a zone plate, one may produce a diffractive focusing with a very large depth-of-focus. Alternatively, one may design the diffractive focusing element to have a larger depth of focus than a conventional Fresnel zone plate, as described by J. Ojeda-Castaneda, and L. R. Barriuel-Valdos in an article entitled "Zone plate for arbitrarily high focal depth" in Applied Optics, vol. 29(7), pp. 994–997 (1990).

Those skilled in the art will appreciate that numerous modifications and variations may be made to the above disclosed embodiments without departing from the spirit and scope of the invention.

What is claimed is:

1. A maskless lithography system comprising an array of apodized diffractive elements, each of which focuses an energy beam into an array of images in order to create a permanent pattern on an adjacent substrate at a focal area and is apodized to reduce at least one of the main or side lobes in an intensity distribution at a focal area.

2. The maskless lithography system as claimed in claim 1, wherein apodized diffractive elements are Fresnel zone plates.

3. The maskless lithography system as claimed in claim 1, wherein apodized diffractive elements are Fresnel phase plates.

4. The maskless lithography system as claimed in claim 1, wherein apodized diffractive elements are blazed Fresnel zone plates.

5. The maskless lithography system as claimed in claim 1, wherein said apodized diffractive elements are formed of photon sieves.

6. The maskless lithography system as claimed in claim 5, wherein said photon sieves are amplitude photon sieves.

7. The maskless lithography system as claimed in claim 5, wherein said photon sieves are phase photon sieves.

8. The maskless lithography system as claimed in claim 5, wherein said photonic sieves are alternating phase photonic sieves.

9. A maskless lithography system comprising an array of diffractive elements, each of which focuses an energy beam into an array of images in order to create a permanent pattern on an adjacent substrate and has a focusing efficiency of at least 50%.

10. The maskless lithography system as claimed in claim 9, wherein said diffractive elements are 100% transmissive.

11. The maskless lithography system as claimed in claim 10, wherein said diffractive elements are alternating phase photon sieves.

12. The maskless lithography system as claimed in claim 9, wherein said diffractive elements are blazed Fresnel zone plates.

13. The maskless lithography system as claimed in claim 9, wherein said diffractive elements are apodized Fresnel zone plates.

14. A maskless lithography system comprising an array of Bessel zone plates, each of which converts an energy beam into an array of Bessel beams in order to create a permanent pattern on an adjacent substrate.

15. A maskless lithography system comprising an array of apodized phase photon sieves, each of which focuses an energy beam into an array of images in order to create a permanent pattern on an adjacent substrate at a focal area and is apodized to reduce at least one of the main or side lobes in an intensity distribution at a focal area.

* * * * *